United States Patent
Varma et al.

(10) Patent No.: US 7,222,288 B2
(45) Date of Patent: May 22, 2007

(54) MODIFIED SOFT OUTPUT VITERBI ALGORITHM FOR TRUNCATED TRELLIS

(75) Inventors: Gottimukkala Narendra Varma, Andhra Pradesh (IN); Garapati Prabhu Charan, Andhra Pradesh (IN); Usha Sahu, Andhra Pradesh (IN)

(73) Assignee: Hellosoft, Inc., San Jose, CA (US)

( * ) Notice: Subject to any disclaimer, the term of this patent is extended or adjusted under 35 U.S.C. 154(b) by 342 days.

(21) Appl. No.: 10/909,220

(22) Filed: Jul. 30, 2004

(65) Prior Publication Data

US 2006/0026494 A1    Feb. 2, 2006

(51) Int. Cl.
*H03M 13/03* (2006.01)

(52) U.S. Cl. .................. 714/795; 714/792; 714/794; 714/796; 375/262; 375/341

(58) Field of Classification Search ............. 714/794, 714/795, 796; 375/262, 341
See application file for complete search history.

(56) References Cited

U.S. PATENT DOCUMENTS

| | | | | |
|---|---|---|---|---|
| 5,181,209 A | | 1/1993 | Hagenauer | |
| 5,319,677 A | * | 6/1994 | Kim | 375/347 |
| 5,825,832 A | * | 10/1998 | Benedetto | 375/341 |
| 5,905,757 A | | 5/1999 | Kundmann | |
| 5,995,562 A | * | 11/1999 | Koizumi | 375/341 |
| 6,529,559 B2 | * | 3/2003 | Reshef | 375/262 |

FOREIGN PATENT DOCUMENTS

EP    01246418 A2    10/2002

* cited by examiner

*Primary Examiner*—Albert Decady
*Assistant Examiner*—Esaw Abraham
(74) *Attorney, Agent, or Firm*—William L. Botjer

(57) ABSTRACT

A method, system and computer program product for obtaining the reliability values for the hard decisions obtained by a Viterbi equalizer in a wireless communication system. A difference parameter is obtained for each Viterbi state at a stage while advancing the Viterbi trellis by the stage. The difference parameter for a Viterbi state at a stage is obtained by subtracting the path metric of the non-surviving path from the path metric of the surviving path for the Viterbi state at the stage. The difference parameter corresponding to the Viterbi state on the ML path at a stage is used as the reliability value for the hard decision obtained at L stages behind the stage, where L is the memory of the Viterbi trellis. A method for obtaining the accurate reliability values for the hard decisions corresponding to the last L stages of a truncated Viterbi trellis is also provided.

18 Claims, 9 Drawing Sheets

MODIFIED SOFT OUTPUT VITERBI ALGORITHM FOR TRUNCATED TRELLIS

BACKGROUND

The present invention relates to a soft output Viterbi algorithm for use in wireless communication systems. More specifically, the present invention relates to an optimized method of obtaining the reliability values for hard decisions obtained by a Viterbi equalizer.

In wireless communication, the transmission channel introduces an Inter Symbol Interference (ISI) in the received signal. An equalizer is used in the wireless receiver to estimate the transmitted signal in the presence of the ISI. A method of equalization, known as maximum likelihood sequence estimation (MLSE), determines the sequence of symbols that is most likely to have been transmitted by the transmitter. MLSE is commonly used in wireless receivers such as the Gaussian Minimum Shift Keying (GMSK) receivers used in the Global System for Mobile (GSM) communication systems. MLSE equalizers use an algorithm known as the Viterbi algorithm, to estimate the maximum likelihood sequence.

The conventional Viterbi algorithm obtains results in the form of the most likely transmitted symbols. However, the algorithm does not provide any information regarding the reliability or likelihood of the obtained results. Therefore, the estimated transmitted symbols are called hard decisions. Further, the hard decisions obtained by the Viterbi equalizer are used by an outer decoder to obtain the decoded transmitted symbols. The performance of the outer decoder depends on the reliability of the hard decisions. The performance of the outer decoder can be enhanced by the knowledge of the reliability of the hard decisions. A modified Viterbi algorithm, known as the Soft Output Viterbi Algorithm (SOVA), obtains the reliability of the hard decisions. The conventional Viterbi algorithm is first described with reference to FIG. 1, FIG. 2 and FIG. 3. Thereafter, an implementation of the SOVA is described.

The Viterbi algorithm estimates the maximum likelihood transmitted signal at the wireless receiver, using the prior knowledge of the received signal, the channel impulse response, and the possible values of transmitted symbols. In order to use the knowledge of the possible values of the transmitted symbols, the MLSE equalizer is implemented as a state machine. The possible states of the equalizer are based on the possible values of the previous L transmitted symbols, where L is the memory of the channel, i.e., the length of the inter symbol interference introduced in the channel. Further, the state transition of the equalizer at a stage is decided by using the channel impulse response and the symbol received at that stage. To efficiently use the information available with the wireless receiver, the Viterbi algorithm uses a Viterbi trellis to represent the states and state transitions of the equalizer. The maximum likelihood sequence of the transmitted symbols is estimated by traversing the Viterbi trellis and determining a set of maximum likelihood state transitions at each stage.

Referring now primarily to FIG. 1, the Viterbi trellis for stages n and n+1 is hereinafter described. A set 102 of the previous L transmitted symbols define the Viterbi state at stage n. Similarly, a set 104 of the previous L transmitted symbols define the Viterbi state at stage n+1. Assuming two possible values $\{p_1, p_2\}$ of the transmitted symbol, $2^L$ Viterbi states are possible at a stage. These Viterbi states are shown as $\{S_1, S_2, \ldots, S_{2^L}\}$. Further, a Viterbi state set $S=\{S_1, S_2, \ldots, S_{2^L}\}$ comprises all possible Viterbi states at a stage.

A possible state transition is hereinafter referred to as a branch. In a Viterbi trellis, two branches originate from each Viterbi state at a stage. Each of these branches corresponds to a possible value of the transmitted symbol. For example, branches 106 and 110, originating from Viterbi state $S_1$ at stage n, correspond to the transmitted symbols $p_1$ and $p_2$, respectively. Further, two branches lead to each state at a stage. For example, branches 106 and 108 lead to Viterbi state $S_1$ at stage n+1. A series of branches (state transitions) is hereinafter referred to as a path.

The Viterbi algorithm uses the Viterbi trellis to estimate the most likely sequence of transmitted symbols. The Viterbi algorithm involves performing a set of steps for each stage, hereinafter referred to as advancing the Viterbi trellis by a stage. The steps involve determining one surviving path leading to each Viterbi state at the stage, and taking a decision regarding a symbol at a finite number of stages N preceding the current stage. After the Viterbi trellis has been advanced by a stage, only one path for each Viterbi state at the stage survives. Therefore, only two possible paths leading to each Viterbi state at the subsequent stage remain. For example, paths 112 and 114 survive for Viterbi states $S_1$ and $S_2$ at stage n−1. Correspondingly, two paths leading to Viterbi state $S_1$ remain at stage n. Once the surviving paths are determined at stage n, a decision is taken regarding a symbol at a finite number of stages N preceding stage n. The method of determining surviving paths and taking the decision is repeated at each stage of the Viterbi trellis, to estimate a maximum likelihood sequence of symbols. The method of determining surviving paths is described with reference to FIG. 2. Further, the method of estimating the maximum likelihood sequence of symbols is described with reference to FIG. 3.

Referring now primarily to FIG. 2, the method of determining surviving paths for stage n, is hereinafter described. At step 202, the received signal is convolved with the conjugate of the time-inverted channel, to obtain a symbol $y_n$ representing the received symbol at stage n. Thereafter, the first Viterbi state from Viterbi state set S is considered as state $S_k$ at step 204. Two possible paths lead to Viterbi state $S_k$ at a stage n+1. At step 206, a path metrics for the first possible path, leading to Viterbi state $S_k$ at stage n+1, is obtained by using the relation $$CM_n(I_n, S_k) = \qquad (1)$$
$$CM_{n-1}(I_{n-1}, S_{k'}) + 2\Re\{I_n * y_n\} - 2\Re\left\{I_n * \sum_{m=1}^{L} I_{n-m} * x_m\right\} - |I_n|^2 x_0$$

where $I_n$ denotes the transmitted symbol at stage n, $S_{k'}$ is the Viterbi state on the first possible path at stage n, $CM_n(I_n, S_k)$ is the path metric of a possible path leading to Viterbi state $S_k$ at stage n+1, as obtained at stage n, $CM_{n-1}(I_{n-1}, S_{k'})$ is the path metric of the surviving path leading to stage $S_{k'}$ at stage n, as obtained at stage n−1, set $\{I_{n-m}, m \in [1,L], m \in I\}$ corresponds to Viterbi state $S_k$, and $x_m$ is the autocorrelation value of the channel impulse response for the time delay of m stages. Further, $\Re(I_n * y_n)$ is the ISI term for stage n. At step 208, the path metric for the second possible path is similarly obtained. At step 210, the path with a higher path metric among the above two possible paths is selected as the surviving path for Viterbi state $S_k$ at stage n+1. The possible path not selected as the surviving path, is considered as the non-surviving path at Viterbi state $S_k$ at stage n. At step 212, it is checked whether Viterbi state $S_k$ is the last state of Viterbi state set S. If the Viterbi state $S_k$ is not found to be the last Viterbi state, then the next state from Viterbi state set S is considered as state $S_k$ at step 214. Steps 206, 208 and 210 are then repeated for the new state $S_k$. Therefore, the surviving paths leading to all the states of Viterbi state set S is determined at stage n.

Referring now primarily to FIG. 3, the method of estimating the maximum likelihood sequence of symbols is hereinafter described. The stage of the Viterbi trellis corresponding to the first symbol to be equalized is considered as stage n, at step 302. At step 303, estimated ISI terms for all Viterbi states are pre-computed. A method of pre-computing the ISI terms is disclosed in co-pending application titled "Efficient Implementation of GSM/GPRS Equalizer" Ser. No. 10/909,232 filed Jul. 30, 2004. It will be apparent to one skilled in the art that various other methods of pre-computation of ISI terms may be employed without deviating from the spirit and scope of the present invention.

At step 304, the Viterbi trellis is then advanced by stage n, in accordance with the method described with reference to FIG. 2. Therefore, step 304 obtains $2^L$ surviving paths, each corresponding to a Viterbi state. Thereafter, the path with the highest path metric is selected from these surviving paths as a maximum likelihood (ML) path at stage n at step 306. At step 308, a trace back along the ML path by a finite number of stages N is performed. A series of branches at multiple stages constitute a path. Also, a branch at a stage corresponds to a state transition, which, in turn, corresponds to a symbol at that stage. Therefore, a path corresponds to a series of symbols. Therefore, step 308 of tracing back determines the symbols at previous stages along the ML path. At step 310, the symbol determined at stage n–N is established as the symbol transmitted at stage n–N by tracing back. At step 312, it is verified whether stage n is the last stage to be equalized. If stage n is not found to be the last stage to be equalized, then the next stage is considered to be stage n at step 314. Steps 304 to 310 are then repeated for the new stage n. Therefore, a sequence of hard decisions, corresponding to the transmitted symbols, is obtained by the above method.

The Soft Output Viterbi Algorithm (SOVA) obtains the reliability values for the hard decisions obtained by the conventional Viterbi algorithm. An implementation of SOVA is disclosed in U.S. Pat. No. 5,181,209, publication date Jan. 19, 1993, titled "Method for generalizing the Viterbi algorithm and devices for executing the method", to Deutsche Forschungsanstalt fur Luft-und Raumfahrt E.V. The patent provides a method of generalizing the conventional Viterbi algorithm, in which the difference costs from two arriving paths are calculated for each Viterbi state. The reliability value at the beginning of each path is set at a high value. Then the reliability value of the ML path is updated at the points where the hard decisions differ from the competing path. The updating is performed in accordance with a table, in which the prior reliability value and the difference costs are inserted into the table as the new input values. Then this new value is taken from the table and is stored, together with hard decisions, as the path memory. Therefore, additional storage at each stage is required compared to the conventional Viterbi algorithm. Finally the reliability value is read out after a decision delay from the stage which provides the result for the ML path. The above-mentioned and other methods of obtaining the reliability values for hard decisions add computational complexity to the conventional Viterbi algorithm. These methods also require additional storage at each stage. Therefore, there exists a need for an implementation of SOVA, which can obtain reliability values in a computationally efficient manner.

In digital communication systems such as GSM, the symbols are transmitted in the form of data bursts. A data burst is a set of symbols comprising control symbols, in addition to data symbols. A data burst, used in GSM, comprises two 58-symbol data sets, and a 26-symbol training sequence in the midamble. The header and footer of the GSM data burst comprise three tail symbols each. The tail symbols and the symbols of the training sequence are known in advance to the wireless receiver. For such data bursts, the Viterbi algorithm uses the known tail symbols to terminate the advancement of the Viterbi trellis. If the last L symbols of a data burst are already known to the receiver, the Viterbi state at the last stage of the trellis can be uniquely determined, since the Viterbi state at a stage depends on previous L symbols. Further, as only one Viterbi state is possible at the last stage, only one path survives at the last stage of the trellis. This path is selected as the maximum likelihood path. However, in certain wireless communication systems, the number of known tail symbols is less than the memory of the channel. For example, in the GSM data burst, three tail symbols are present. However, the memory of the channel, and hence the memory of the Viterbi trellis, is four. In such cases, more than one path survives at the last stage of the Viterbi trellis. The surviving path with highest path metric is selected as the ML path. Such a Viterbi trellis is known as the truncated Viterbi trellis. In an equalization that uses a truncated Viterbi trellis, the reliability value of the hard decision is critical for the performance of the outer decoder.

An approach to solve the above-mentioned insufficient number of tail bits problem pre-processes the received signal, to reduce the affect of ISI. The pre-processed received signal is then equalized, using a Viterbi equalizer with a memory less than the memory of the channel. Therefore, the required memory of a Viterbi equalizer can be reduced to the number of tail bits available. This approach suffers with the low accuracy of the hard decisions in estimating of the transmitted symbols. Further, for a truncated trellis, the SOVA implementation discussed above, provides the hard decisions by selecting the ML path from the paths surviving at the last stage, on the basis of the path metrics. However, they fail to provide a method of obtaining reliability values for the last L symbols. Therefore, there is a need of a method which can provide accurate hard decisions, along with a method of obtaining the reliability values for all the symbols of a data burst.

SUMMARY

The present invention is directed towards a method, system and computer program product for obtaining reliability values and hard decisions by using a Viterbi equalizer in a wireless receiver.

An objective of the present invention is to obtain the reliability values for hard decisions obtained by a Viterbi equalizer, with increased computational efficiency.

A further objective of the present invention is to obtain the reliability values for the stages of a truncated Viterbi trellis corresponding to the trailing symbols of a data burst.

Another objective of the present invention is to provide reliability values to enhance to performance of an outer decoder.

Yet another objective of the present invention is to obtain reliability values without affecting the accuracy of the hard decisions.

The above-mentioned objectives of the present invention are achieved by providing an implementation of the SOVA that uses the difference between the path metric of the surviving and the non-surviving paths at a stage on the ML path as a measure of the accuracy of the hard decision at a previous stage. In accordance with the invention, while advancing the Viterbi trellis by a stage, a difference parameter is obtained for each Viterbi state at the stage. The difference parameter corresponding to the Viterbi state on the ML path at L stages ahead of a stage is identified as the reliability value for the hard decision obtained at the stage, where L is the memory of the Viterbi trellis.

Further, the present invention provides a method of obtaining the reliability values for the last L stages of a truncated Viterbi trellis. In accordance with the method, a surviving path at the last stage of the truncated Viterbi trellis is selected as the ML path. The surviving paths which have not been selected as the maximum likelihood path are considered as the competing paths. A competing path parameter corresponding to each competing path is then obtained by subtracting the path metric of the competing path from the path metric of the ML path, at the last stage of the truncated Viterbi trellis. For each of the last L stages of the truncated Viterbi trellis, the competing paths yielding a hard decision different from the ML path are identified. The minimum of the competing path parameters corresponding to the identified competing paths at a stage is identified as the reliability value for the hard decision at the stage.

The present method, system and computer program product efficiently obtain the reliability values for the hard decisions obtained by a Viterbi equalizer. The present invention uses only the difference parameter to obtain the reliability values. Therefore, only one subtraction operation per Viterbi state per stage has to be performed to obtain reliability values. Therefore, as compared to the prior art, the reliability values are obtained by only a small addition to the complexity of the conventional Viterbi algorithm. Further, the method of obtaining reliability values for the last L symbols solves the problem posed by the insufficient number of tail bits. The reliability values for the last L symbols, obtained in accordance with the present invention, substantially enhances the performance of the outer decoder, compared to the prior art. Also, the reliability values are obtained without affecting the accuracy of the hard decisions.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which.

DESCRIPTION OF PREFERRED EMBODIMENTS

The present invention provides a system, a method and a computer program product to obtain the reliability values for the hard decisions obtained by a Viterbi equalizer. The present invention utilizes only the difference in the path metrics of the surviving and non-surviving paths at a stage on the ML path, to obtain the reliability values for the hard decisions yielded by the ML path. Unlike the prior art, the present invention does not traverse the competing paths to obtain the reliability values for the intermediate symbols of a set of symbols being equalized. The difference in the path metrics of the surviving and non-surviving paths at a stage on the ML path is the measure of the probability of the correct estimation of the transmitted symbol at the $L^{th}$ previous stage. This property of the Viterbi trellis is used by the present invention to obtain the reliability values in a computationally efficient manner. Further, the invention provides a method of obtaining the accurate reliability values for the hard decisions corresponding to the last L data symbols of a data burst in the case of a truncated Viterbi trellis.

The method, in accordance with the present invention, obtains the hard decisions and the reliability values for a given set of transmitted symbols. A finite number of symbols from a non-burst-based symbol sequence may be selected as the set of transmitted symbols. Alternatively, a data set from a data burst may also be selected as the set of transmitted symbols. For example, in an embodiment the 58-symbol data set from the GSM data burst is selected as the set of transmitted symbols. The above examples are provided to clearly illustrate the invention, and in no way limit the scope of the invention which can be implemented with various other sets of transmitted symbols.

Figure 1:
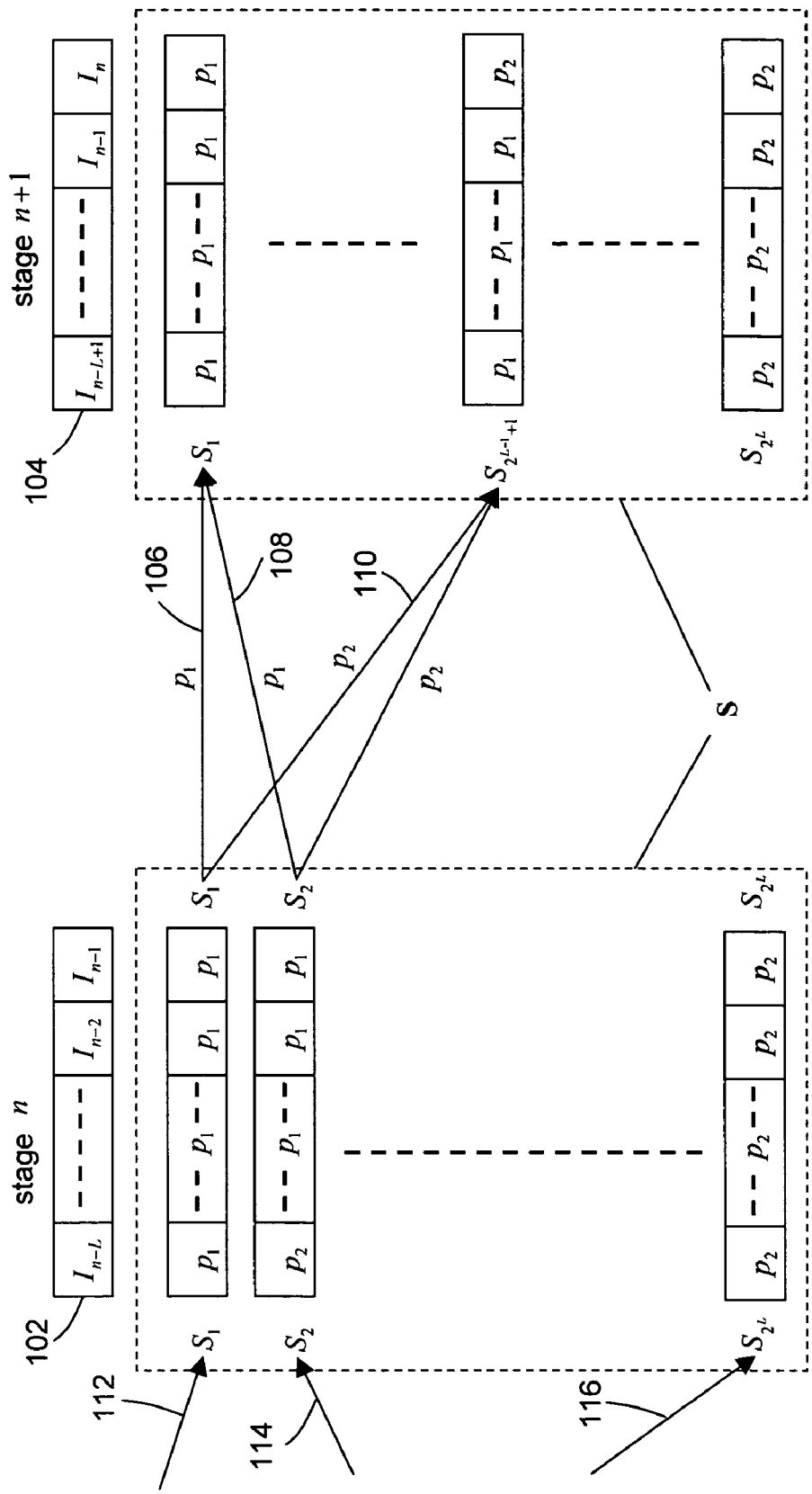
FIG. 1 is a block diagram illustrating the Viterbi trellis, in accordance with the prior art.
Figure 2:
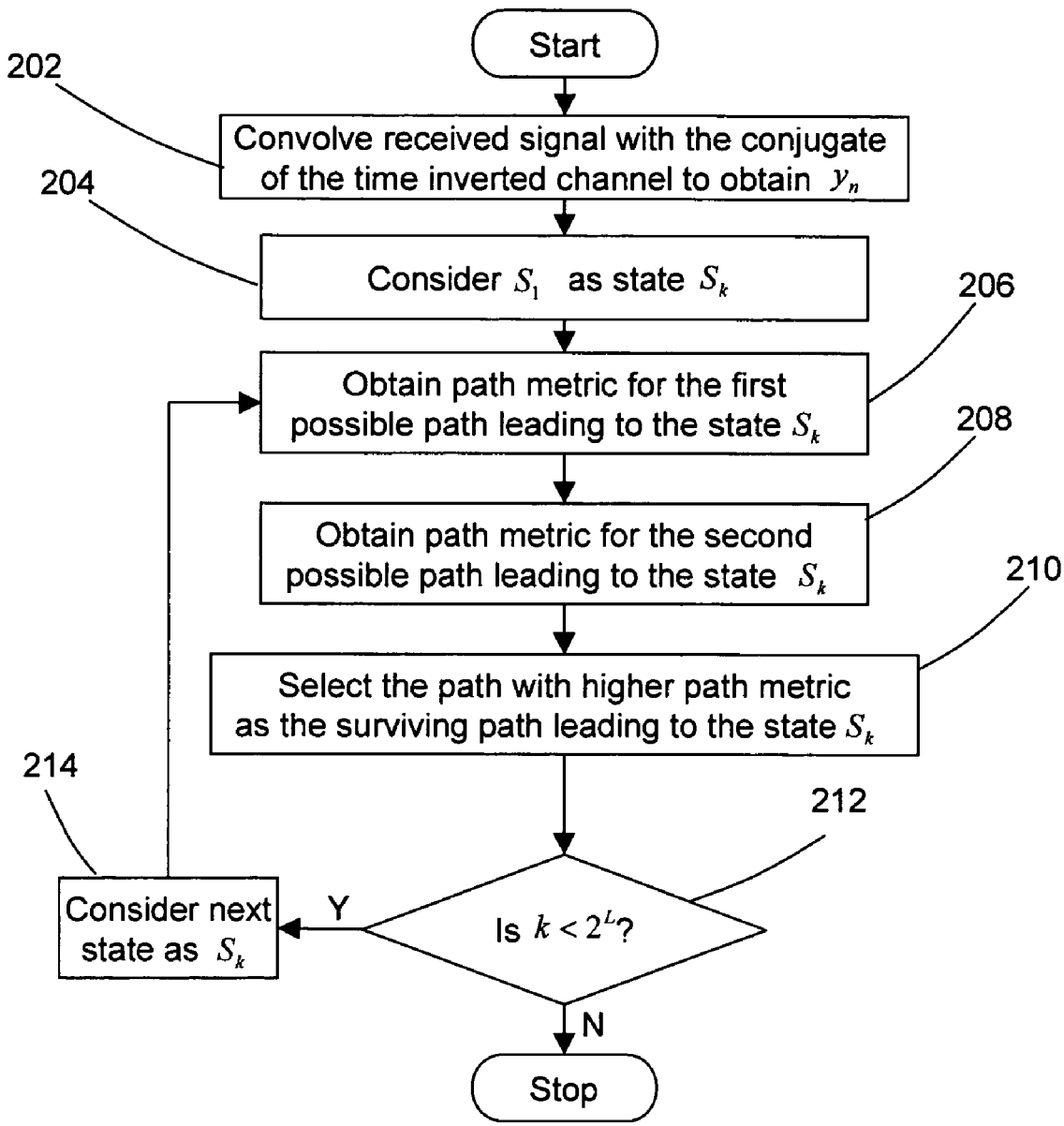
FIG. 2 is a flowchart illustrating the prior art method of determining surviving paths at a stage.
Figure 3:
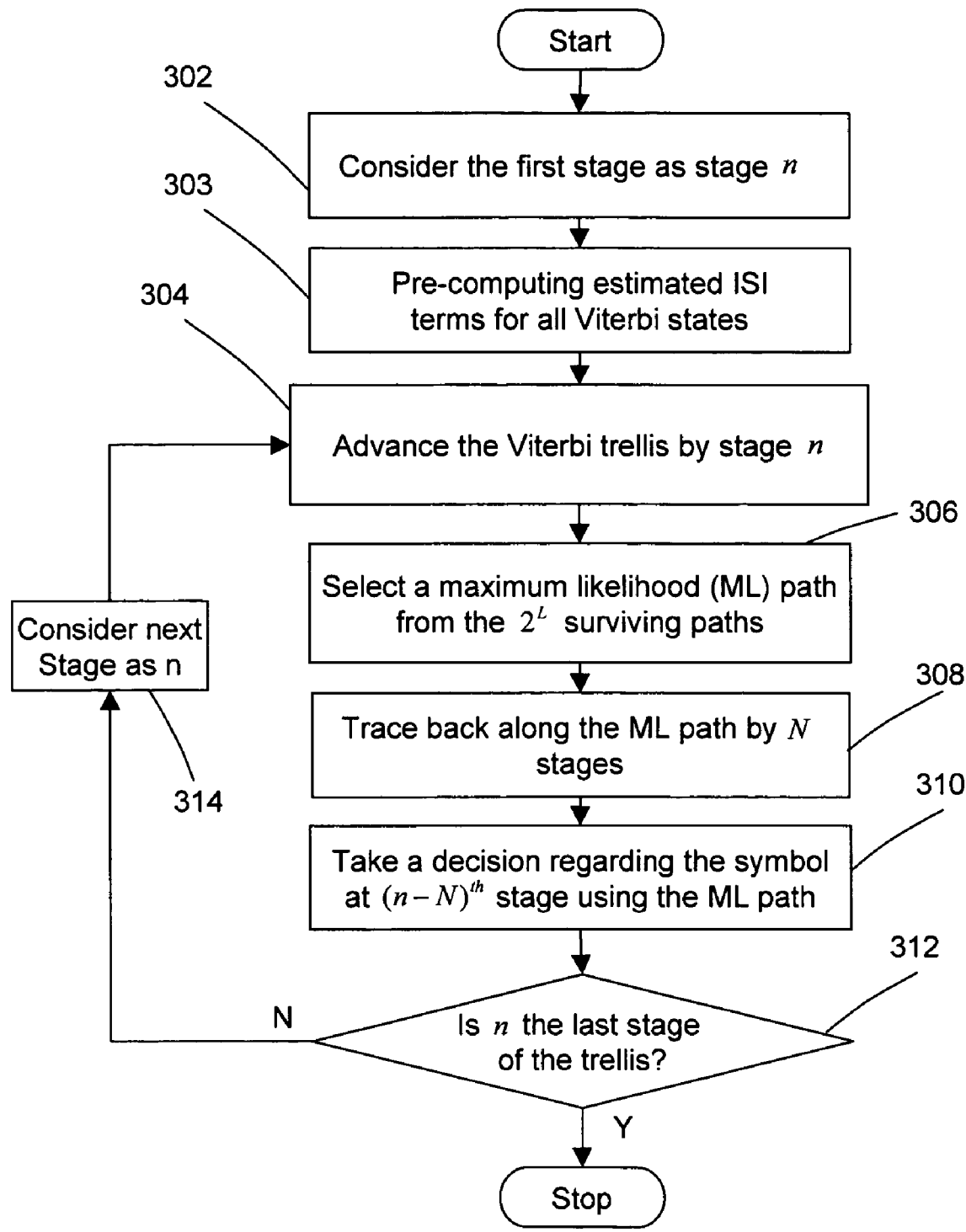
FIG. 3 is a flowchart illustrating a prior art method of estimating the maximum likelihood sequence by using the Viterbi algorithm.
Figure 4A:
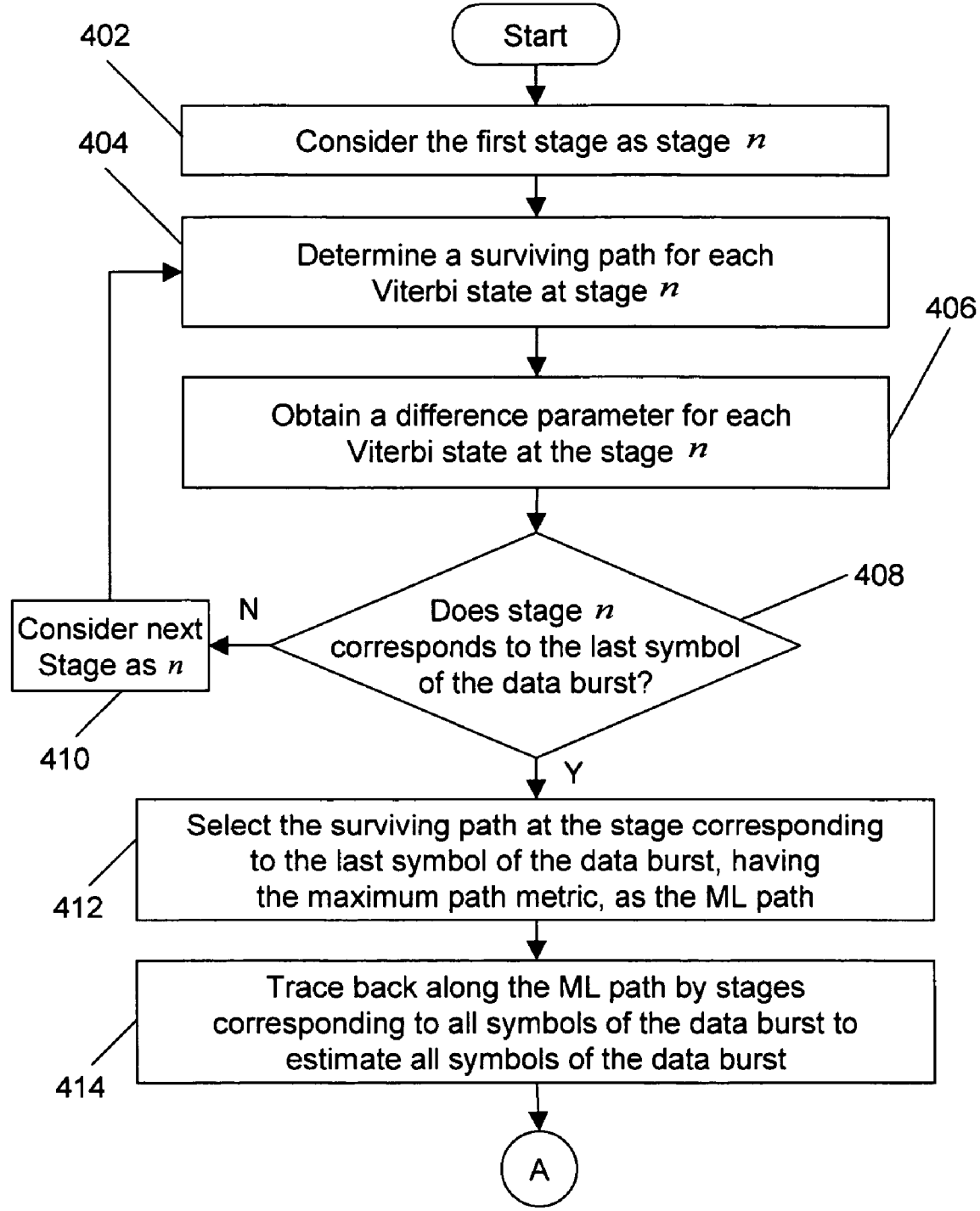
FIG. 4A is a flowchart illustrating a method of obtaining the hard decisions using the Viterbi equalizer, in accordance with the present invention.

Referring now primarily to FIG. 4A, a method of obtaining hard decisions by using a Viterbi equalizer, in accordance with the present invention, is hereinafter described. In accordance with the method, the stage corresponding to the first symbol of the set of transmitted symbols is considered as stage n at step 402. The surviving path for each Viterbi state at stage n is then obtained at step 404. Step 404 is performed in accordance with the method described with reference to FIG. 2. At step 406, a difference parameter corresponding to each Viterbi state at stage n is obtained. In an embodiment of the present invention, step 406 is performed using the following relation:

$$D_n = \Gamma(S_n, S_{n-1}) - \Gamma(S_n, S'_{n-1}) \qquad (2)$$

Where $D_n$ is the difference parameter for a Viterbi state at stage n, $\Gamma(S_n, S_{n-1})$ is the path metric of the surviving path leading to the Viterbi state at stage n, and $\Gamma(S_n, S'_{n-1})$ is the path metric of the non-surviving path leading to the Viterbi state at stage n. Thereafter, it is verified whether stage n corresponds to the last symbol of the set of transmitted symbols at step 408. If stage n does not correspond to the last symbol of the set of transmitted symbols, then the stage corresponding to the next symbol of the set of transmitted symbols is considered as stage n at step 410. Steps 404-408 are then repeated for the new considered stage n. At step 412, an ML path is obtained by selecting the surviving path with the maximum path metric from the surviving paths at the stage corresponding to the last symbol of the set of transmitted symbols. The surviving paths, which are not selected as the ML path, are considered to be competing paths. Hard decisions corresponding to all the symbols of the set of transmitted symbols are obtained by tracing back along the ML path at step 414. Step 414 of tracing back along the ML path is performed in accordance with steps 308 and 310, described with reference to FIG. 3.

Figure 4B:
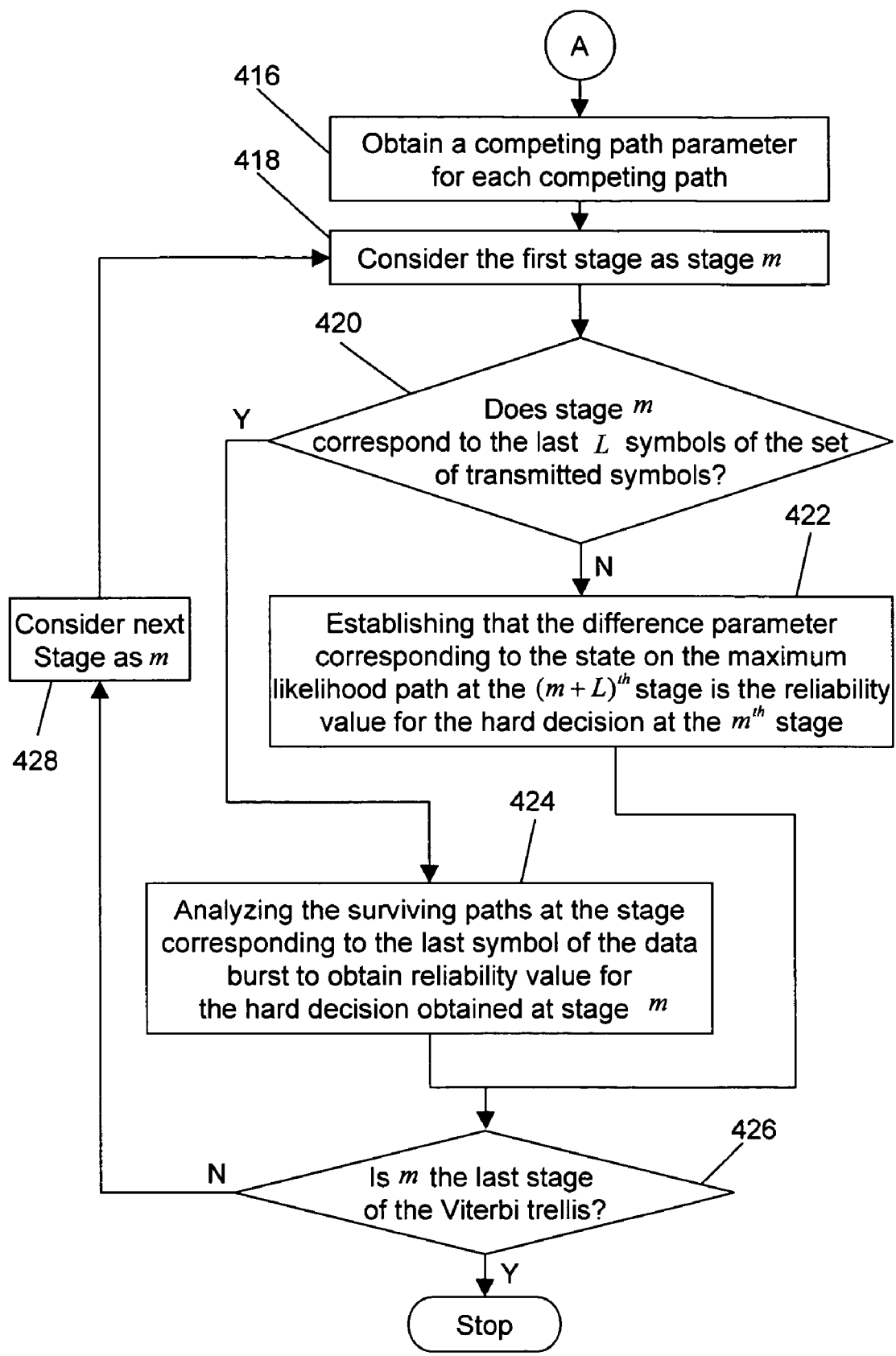
FIG. 4B is a flowchart illustrating a method of obtaining the reliability value for the hard decisions obtained by the Viterbi equalizer, in accordance with the present invention.

Referring now primarily to FIG. 4B, a method of obtaining reliability values for the hard decisions obtained by a Viterbi equalizer, in accordance with the present invention is hereinafter described. Once the hard decisions corresponding to all the symbols of the set of transmitted symbols are obtained, a competing path parameter is obtained for each competing path at step 416. The competing path parameter for a competing path is obtained by subtracting the path metric of the competing path from the path metric of the ML path at the stage corresponding to the last symbol of the set of transmitted symbols. Thereafter, the stage corresponding to the first symbol of the set of transmitted symbols, is again considered as stage m, at step 418. Thereafter, it is verified whether stage m corresponds to the last L symbols of the set of transmitted symbols at step 420. If stage m does not correspond to the last L stages of the set of transmitted symbols, then at step 422, it is established that the difference parameter corresponding to the state on the maximum likelihood path at the stage (m+L) is the reliability value for the hard decision at stage m. If stage m corresponds to the last L symbols of the set of transmitted symbols, then the competing paths are analyzed to obtain the reliability value for the hard decision obtained at stage m at step 424. Step 424 is further described with reference to FIG. 5. Once the reliability value at stage m is obtained, it is verified whether stage m corresponds to the last symbol of the set of transmitted symbols at step 426. If stage m does not correspond to the last symbol of the set of transmitted symbols, the next stage of the Viterbi trellis is considered as stage m at step 428. Steps 420-426 are repeated for the new stage m.

Figure 5:
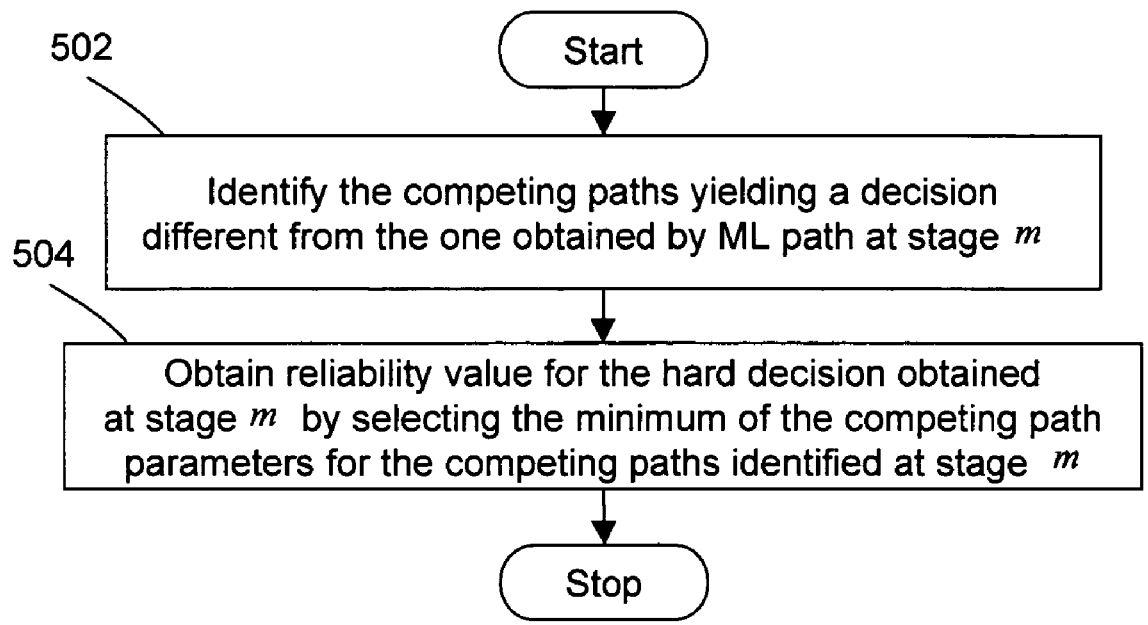
FIG. 5 is a flowchart illustrating a method of analyzing the surviving paths, to obtain the reliability value for a stage corresponding to one of the last L symbols of the set of transmitted symbols, in accordance with the present invention.

Referring now primarily to FIG. 5, a method of analyzing the competing paths, to obtain the reliability value for the hard decision obtained at stage m corresponding to one of the last L symbols of the set of transmitted symbols, in accordance with the present invention is hereinafter described. At step 502, the competing paths that yield a decision different from the one obtained by the ML path at stage m are identified. At step 504, the minimum of the competing path parameters, corresponding to the competing paths identified at step 502, is selected as the reliability value for the hard decision obtained at stage m.

Figure 6:
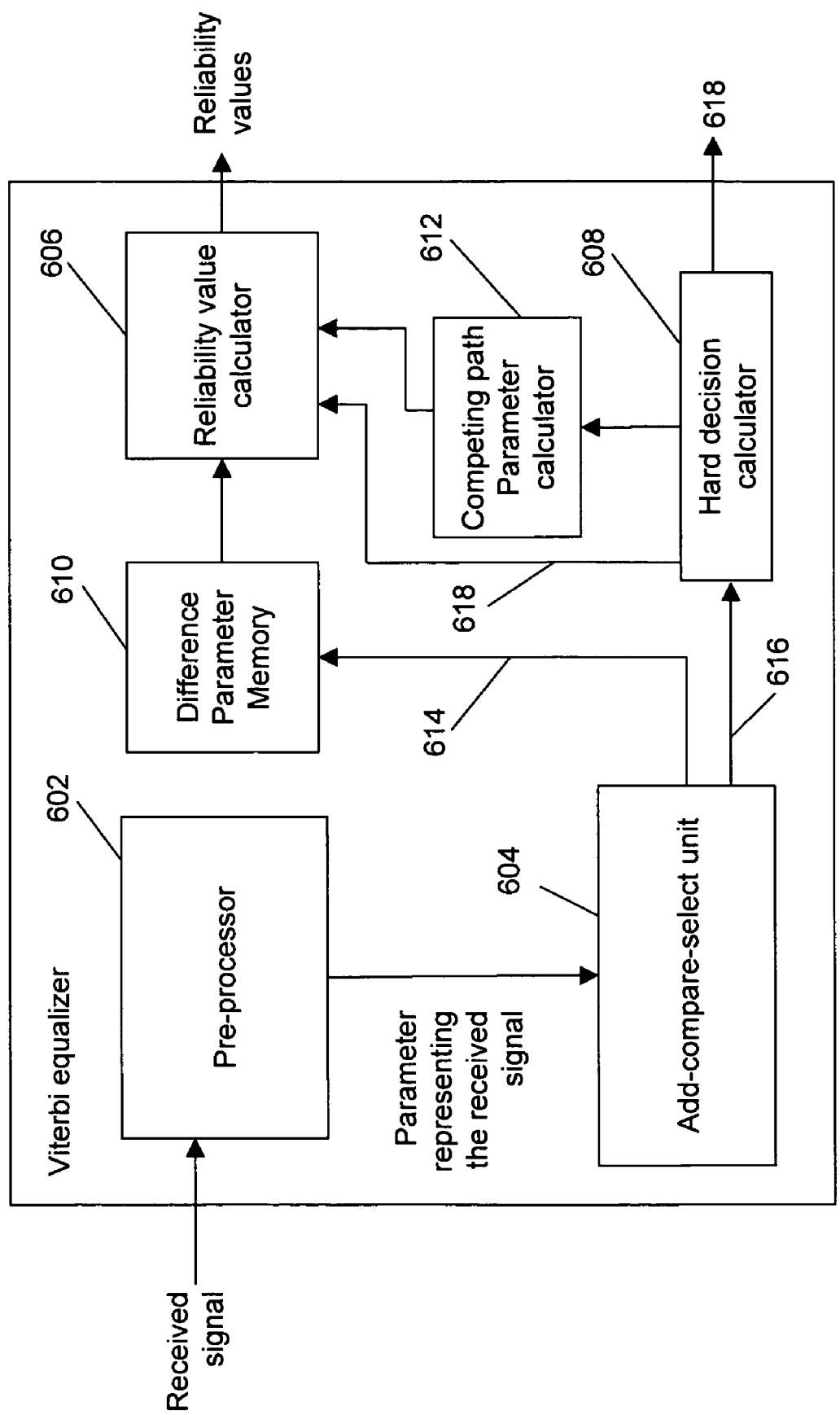
FIG. 6 is a block diagram illustrating a Viterbi equalizer, for obtaining reliability values and hard decisions, in accordance with the present invention.

Referring now primarily to FIG. 6, a Viterbi equalizer for obtaining reliability values and hard decisions, in accordance with the present invention, is hereinafter described. The Viterbi equalizer comprises a pre-processor 602, an add-compare-select unit 604, a reliability value calculator 606, a hard decision calculator 608, a difference parameter memory 610 and a competing path parameter calculator 612. Pre-processor 602 convolves the signal received by the wireless receiver with the conjugate of the time-inverted channel to obtain a parameter representing the received symbol at the stage. Add-compare-select unit 604 advances the Viterbi trellis by a stage using the parameter representing the received symbol at the stage. Add-compare-select unit 604 also obtains the difference parameter, represented by 614, corresponding to each Viterbi state at the stage. Difference parameter memory 610 stores the difference parameters obtained by add-compare-select unit 604. Hard decision calculator 608 obtains the hard decision, represented by 618, corresponding to a stage using the surviving paths, represented by 616, obtained by add-compare-select unit 604. Add-compare-select unit 604 and Hard decision calculator 608 is explained with reference to FIG. 7. Reliability value calculator 606 obtains the reliability values for the hard decisions obtained by hard decision calculator 608. Reliability value calculator 606 and competing path parameter calculator 612 is explained with reference to FIG. 8.

Figure 7:
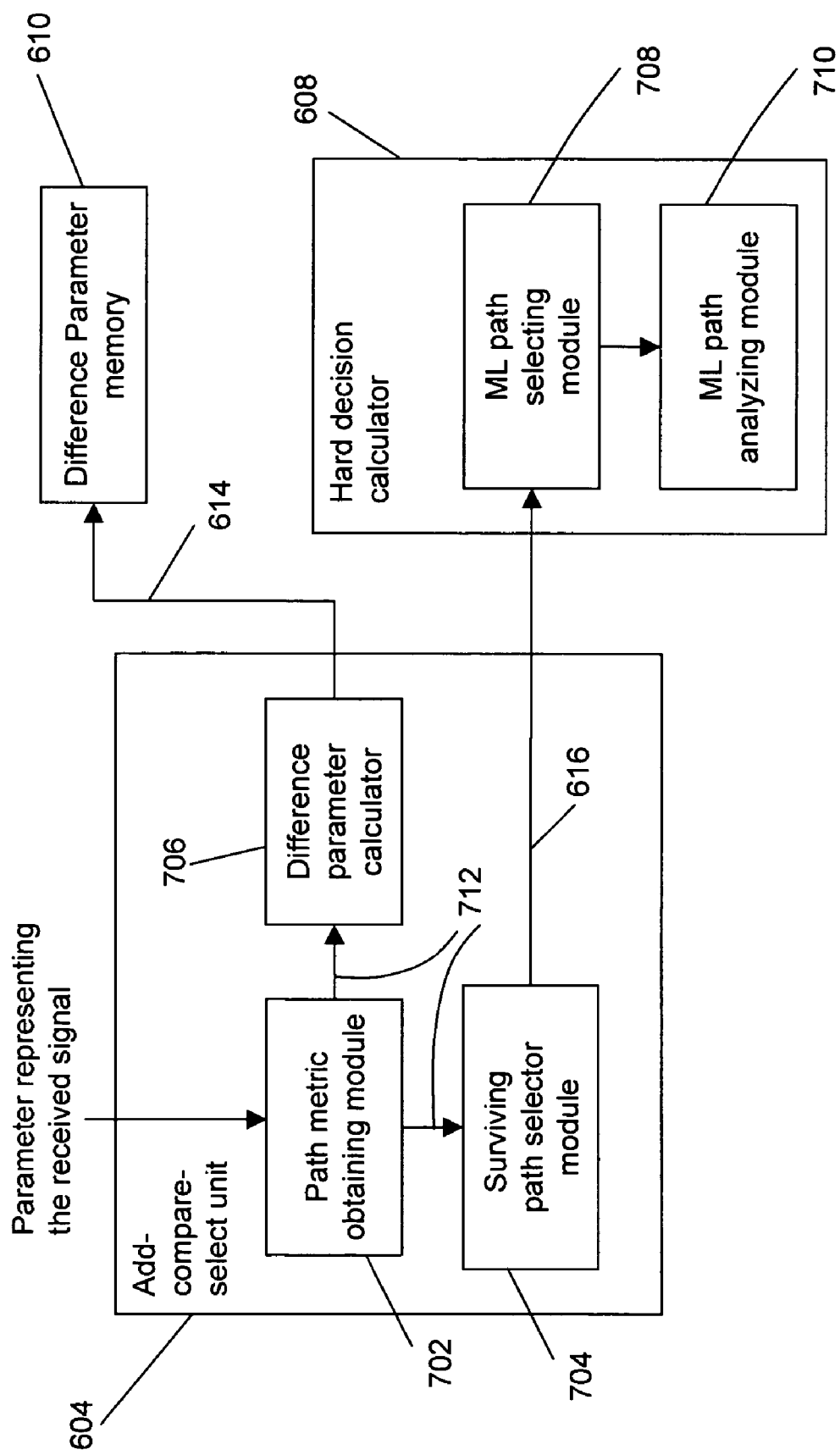
FIG. 7 is a block diagram illustrating an add-compare-select unit, and a hard decision calculator operating in accordance with the present invention.

Referring now primarily to FIG. 7, add-compare-select unit 604 and hard decision calculator 608 operating in accordance with the present invention, is hereinafter described. Add-compare select unit 604 comprises a path metric obtaining module 702, a surviving path selector module 704, and a difference parameter calculator 706. Path metric obtaining module 702, obtains the path metric, represented by 712, of the two possible paths leading a Viterbi state at a stage. Surviving path selector module 704 uses the path metric obtained by path metric obtaining module 702 to determine the surviving path leading to a Viterbi state at a stage. Path metric obtaining module 702 and surviving path selector module 704 operate in accordance with the method described with reference to FIG. 2. Difference parameter calculator 706 obtains a difference parameter corresponding to a Viterbi state at a stage by subtracting the path metric of the surviving path from the path metric of the non-surviving path leading to the Viterbi state at the stage. The obtained difference parameter is stored in difference parameter memory 610 by difference parameter calculator 706. Hard decision calculator 608 comprises an ML path selecting module 708 and an ML path analyzing module 710. ML path selecting module 708 selects the surviving path with the maximum path metric at the stage corresponding to the last symbol of the set of transmitted symbols, as the ML path. ML path selecting module 708 also establishes that the surviving paths which have not been selected as the ML path are the competing paths. ML path analyzing module 710 traces back along the ML path to obtain hard decisions corresponding to all the symbols of the set of transmitted symbols. ML path analyzing module 710 operates in accordance with steps 308 and 310, described with reference to FIG. 3.

Figure 8:
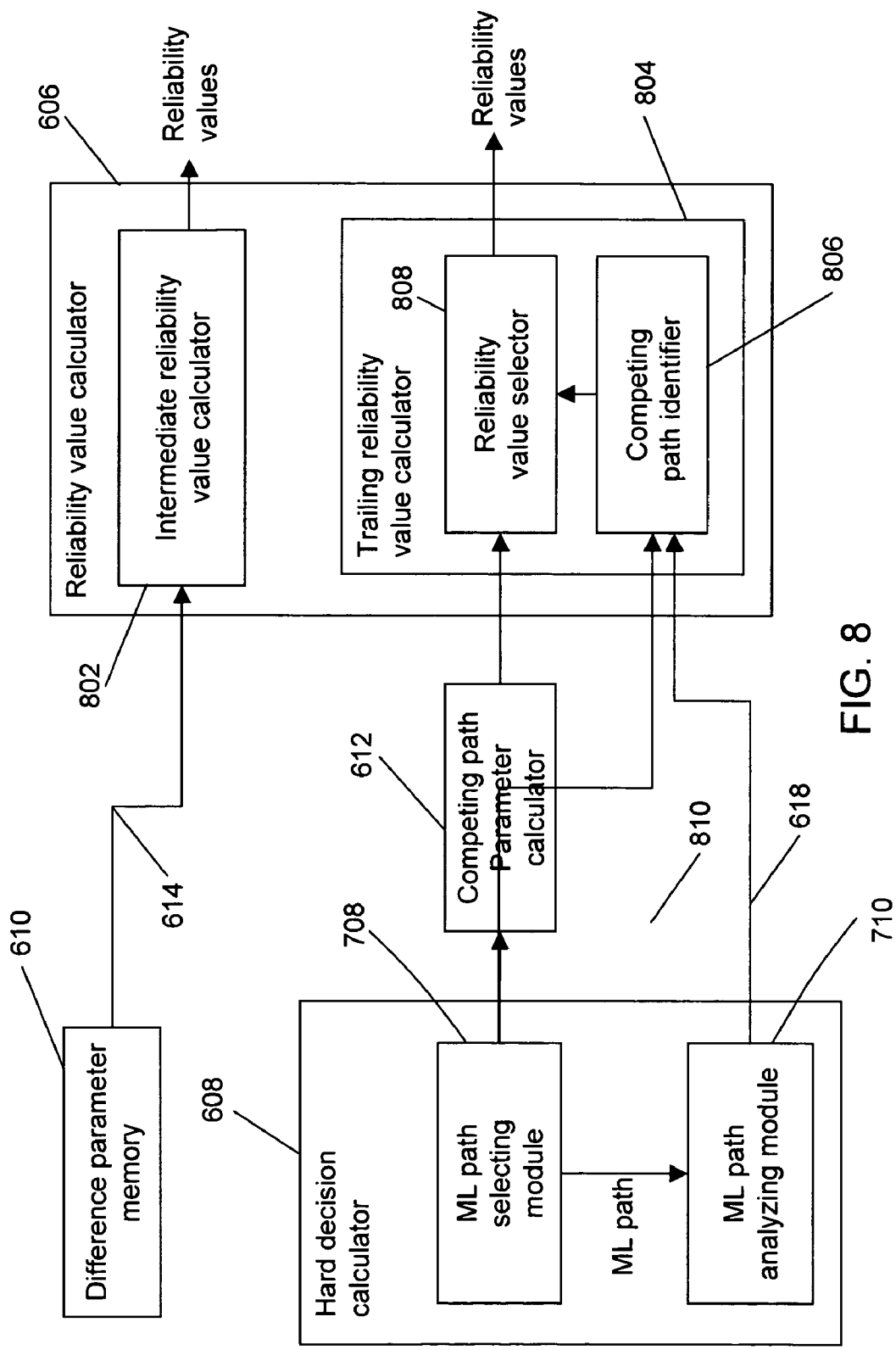
FIG. 8 is block diagram illustrating a reliability value calculator and a competing path parameter calculator operating in accordance with the present invention.

Referring now primarily to FIG. 8, reliability value calculator 606 and competing path parameter calculator 612 operating in accordance with the present invention, is hereinafter described. Reliability value calculator 606 comprises an intermediate reliability value calculator 802 and a trailing reliability value calculator 804. Trailing reliability value calculator 804 obtains the reliability values for the hard decisions corresponding to the last L symbols of the set of transmitted symbols. Intermediate reliability value calculator 802 obtains the reliability values for the hard decisions corresponding to all the symbols except the last L symbols of the set of transmitted symbols. Intermediate reliability value calculator 802 establishes that the difference parameter corresponding to the state on the ML path at L stages ahead of a stage is the reliability value for the stage.

Further, trailing reliability value calculator 804 comprises a competing path identifier 806, and a reliability value selector 808. Competing path parameter calculator 612 obtains a competing path parameter for each competing path, represented by 810, by subtracting the path metric of the competing path from the path metric of the ML path at the stage corresponding to the last symbol of the data burst. The competing path identifier identifies the competing paths yielding a decision different from the hard decision yielded by the ML path at a stage. Further, the reliability value selector selects the minimum of the competing path parameters, corresponding to the competing paths identified by the competing path identifier, as the reliability value for the hard decisions obtained at the stage.

The present invention may be implemented by using a dedicated Application Specific Integrated Circuit (ASIC). Alternately, it may be implemented by using a Digital Signal Processor (DSP) chip or a Field Programmable Gate Array (FPGA). It will be apparent to one skilled in the art that the present invention may also be embodied in a computer program product, using either a processor-specific assembly language or a high-level language such as C. The computer program product embodiment of the present invention can be used for either the implementation of an SOVA-based equalizer or of a simulation model of the SOVA-based equalizer.

The present method, system and computer program product efficiently obtain the reliability values for the hard decisions obtained by a Viterbi equalizer. The present invention uses only the difference parameter to obtain the reliability values. Therefore, only one subtraction operation per Viterbi state per stage has to be performed to obtain reliability values. Therefore, as compared to the prior art, the reliability values are obtained by only a small addition to the complexity of the conventional Viterbi algorithm. Further, the method of obtaining reliability values for the last L symbols solves the problem posed by the insufficient number of tail bits. The reliability values for the last L symbols, obtained in accordance with the present invention, substantially enhances the performance of the outer decoder, compared to the prior art. Also, the reliability values are obtained without affecting the accuracy of the hard decisions.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. A method of obtaining reliability values and hard decisions for a set of transmitted symbols using a Viterbi equalizer at a wireless receiver, a Viterbi trellis having a memory of L stages, the method comprising the steps of:
   a. advancing the Viterbi trellis by all stages corresponding to the set of transmitted symbols, for each stage performing the steps of:
      i. selecting a surviving path from two paths leading to each Viterbi state at the stage, wherein the path not being selected as the surviving path is considered as the non-surviving path; and
      ii. obtaining a difference parameter corresponding to each Viterbi state at the stage;
   b. obtaining hard decisions corresponding to all symbols of the set of transmitted symbols using a maximum likelihood path selected from the surviving paths at the stage corresponding to the last symbol of the set of transmitted symbols; and
   c. obtaining reliability values for hard decisions obtained at all stages, for each stage performing the step of:
      if the stage does not correspond to the last L symbols of the set of transmitted symbols then performing the step of:
         i. establishing that the difference parameter corresponding to the state on the maximum likelihood path at L stages ahead of the stage is the reliability value for the hard decision obtained at the stage;
      else performing the step of:
         i. analyzing the surviving paths at the stage corresponding to the last symbol of the set of transmitted symbols to obtain reliability value for the hard decision obtained at the stage.

2. The method as recited in claim 1 wherein the step of selecting the surviving path from the two paths leading to each Viterbi state at the stage comprises for each Viterbi state at the stage performing the steps of:
   a. obtaining the path metric of the first path leading to the Viterbi state at the stage;
   b. repeating step (a) for the second path leading to the Viterbi state at the stage; and
   c. selecting the path having higher value of the path metric as the surviving path leading to the Viterbi state at the stage, wherein the path having lower value of the path metric is considered as the non-surviving path leading to the Viterbi state at the stage.

3. The method as recited in claim 1 wherein the step of obtaining a difference parameter corresponding to each Viterbi state at the stage comprises for each Viterbi state at the stage performing the step of subtracting the path metric of the non-surviving path from the path metric of the surviving path leading to the Viterbi state at the stage to obtain the difference parameter corresponding to the Viterbi state at the stage.

4. The method as recited in claim 1 wherein the step of obtaining hard decisions comprises the steps of:
   a. selecting the surviving path at the stage corresponding to the last symbol of the set of transmitted symbols, having the maximum path metric as the maximum likelihood path, wherein the surviving paths at the stage corresponding to the last symbol of the set of transmitted symbols, not being selected as the maximum likelihood path are considered as competing paths; and
   b. tracing back along the maximum likelihood path by all stages corresponding to the symbols of the set of transmitted symbols to obtain the hard decisions corresponding to all symbols of the set of transmitted symbols.

5. The method as recited in claim 4 further comprising, for each competing path performing the step of subtracting the path metric of the competing path from the path metric of the maximum likelihood path to obtain a competing path parameter corresponding to the competing path.

6. The method as recited in claim 1 wherein the step of analyzing the surviving paths at the stage corresponding to the last symbol of the set of transmitted symbols to obtain the reliability value for the hard decision obtained at a stage comprises the steps of:
   a. identifying the competing paths which yield decisions different from the hard decision at the stage; and
   b. selecting the minimum competing path parameter corresponding to the identified competing paths as the reliability value for the hard decision obtained at the stage.

7. The method as recited in claim 1 further comprising the step of:
   a. pre-computing estimated Inter Symbol Interference (ISI) terms for all Viterbi states.

8. The method as recited in claim 1 wherein the step of advancing the Viterbi trellis comprises for each stage performing the step of:
   a. convolving the signal received at the wireless receiver with a conjugate of the time-inverted channel to obtain a parameter representing the received symbol at the stage.

9. The method as recited in claim 8 wherein the step of obtaining the path metric of the first path leading to a Viterbi state at the stage is performed using the estimated Inter Symbol Interference (ISI) term corresponding to the Viterbi state, the parameter representing the received symbol at the stage and the path metric of the surviving paths at the previous stage.

10. The method as recited in claim 1 wherein one or more of the steps are embodied in a computer program product.

11. A method of obtaining reliability values and hard decisions for a set of transmitted symbols using a Viterbi equalizer at a wireless receiver, a Viterbi trellis having a memory of L stages, the method comprising the steps of:
   a. pre-computing estimated Inter Symbol Interference (ISI) terms for all Viterbi states;
   b. advancing the Viterbi trellis by stages corresponding to all symbols of the set of transmitted symbols, the step of advancing comprising for each stage performing the steps of:
      i. convolving signal received at the wireless receiver with a conjugate of the time-inverted channel to obtain a parameter representing the received symbol at the stage; and
      ii. for each Viterbi state at the stage performing the steps of:
         1. obtaining the path metric of the first path leading to the Viterbi state at the stage using the estimated ISI term corresponding to the Viterbi state, parameter representing the received symbol at the stage and the path metrics of the surviving paths at the previous stage;
         2. repeating step (1) for the second path leading to the Viterbi state at the stage;
         3. selecting the path having higher value of the path metric as a surviving path leading to the Viterbi state at the stage, wherein the path having lower value of the path metric is considered as the non-surviving path leading to the Viterbi state at the stage; and
         4. obtaining a difference parameter corresponding to the Viterbi state at the stage by subtracting the path metric of the non-surviving path from the path metric of the surviving path leading to the Viterbi state at the stage;
   c. selecting the surviving path, at the stage corresponding to the last symbol of the set of transmitted symbols, having the maximum path metric as a maximum likelihood path, wherein the surviving paths at the stage corresponding to the last symbol of the set of transmitted symbols not being selected as the maximum likelihood path are considered as competing paths;
   d. tracing back along the maximum likelihood path by stages corresponding to all symbols of the set of transmitted symbols to obtain the hard decisions corresponding to all symbols of the set of transmitted symbols;
   e. subtracting the path metric of the first competing path from the path metric of the maximum likelihood path to obtain a competing path parameter corresponding to the first competing path;
   f. repeating step (e) for each competing path; and
   g. obtaining reliability values for all hard decisions obtained at step (d), the step of obtaining reliability values comprising for each stage performing the step of:
      if the stage does not correspond to the last L symbols of the set of transmitted symbols, then performing the step of:
         iii. establishing that the difference parameter corresponding to the state on the maximum likelihood path at the L stage ahead of the stage is the reliability value for the hard decision obtained at the stage;
      else performing the steps of:
         i. identifying the competing paths which yield decisions different from the hard decision at the stage; and
         ii. selecting the minimum competing path parameter corresponding to the identified competing paths as the reliability value for the hard decision obtained at the stage.

12. The method as recited in claim 11 wherein one or more of the steps are embodied in a computer program product.

13. A system suitable for being used as a Viterbi equalizer obtaining reliability values and hard decisions for a set of transmitted symbols at a wireless receiver, a Viterbi trellis having a memory of L stages, the system comprising:
   a. an add-compare-select unit advancing the Viterbi trellis by a stages, the add-compare-select unit comprising:
      ii. means for selecting the surviving path from the two paths leading to a Viterbi state at a stage, wherein the path not selected as the surviving path is considered as the non-surviving path leading to the Viterbi state at the stage; and
      iii. means for obtaining a difference parameter corresponding to a Viterbi state at a stage by subtracting the path metric of the non-surviving path from the path metric of the surviving path at the Viterbi state at the stage;
   b. means for selecting the surviving path having the maximum path metric as the maximum likelihood path, wherein the surviving paths not selected as the maximum path metric are considered as competing paths;
   c. means for tracing back along the maximum likelihood path to obtain the hard decisions corresponding to all symbols of the set of transmitted symbols; and
   d. means for obtaining reliability values for obtained hard decisions comprising:
      iv. means for identifying the difference parameter corresponding to the state on the maximum likelihood path at L stages ahead of a stage as the reliability value for the hard decision obtained at the stage; and
      v. means for analyzing the competing paths at the stage corresponding to the last symbol of the set of transmitted symbols to obtain reliability value for the hard decision obtained at a stage corresponding to one of the last L symbols of the set of transmitted symbols.

14. The system as recited in claim 13 further comprising:
   a. a pre-processor convolving the signal received by the wireless receiver with a conjugate of the time-inverted channel to obtain a parameter representing the received symbol at the stage.

15. The system as recited in claim 14 wherein the means for selecting the surviving path comprises:
   a. means for obtaining the path metric of the two paths leading to a Viterbi state at a stage using the parameter representing the received symbol at the stage and the path metric of the surviving path at the previous stage; and
   b. means for selecting the path with higher path metric as the surviving path leading to the Viterbi state the stage.

16. The system as recited in claim 13 further comprising:
   a. a difference parameter memory storing the difference parameters obtained by the add-compare-select unit.

17. The system as recited in claim 13 further comprising the means for subtracting the path metric of a competing path from the path metric of the maximum likelihood path to obtain a competing path parameter corresponding to the competing path.

18. The system as recited in claim 13 wherein the means for analyzing the competing paths comprises:
   a. means for identifying the competing paths which yield decisions different from the hard decision at the stage; and
   b. means for selecting the minimum competing path parameter corresponding to the identified competing paths as the reliability value for the hard decision obtained at the stage.

* * * * *